United States Patent [19]

Hamakawa et al.

[11] Patent Number: 4,875,943
[45] Date of Patent: Oct. 24, 1989

[54] FLEXIBLE PHOTOVOLTAIC DEVICE

[75] Inventors: Yoshihiro Hamakawa, Kawanishi; Yoshihisa Tawada; Kazunori Tsuge, both of Kobe; Masanobu Izumina, Omiya, all of Japan

[73] Assignee: Kanegafuchi Kagaku Kogyo Kabushiki Kaisha, Osaka, Japan

[21] Appl. No.: 202,608

[22] Filed: Jun. 6, 1988

Related U.S. Application Data

[62] Division of Ser. No. 835,717, Mar. 3, 1986, Pat. No. 4,773,942, which is a division of Ser. No. 439,627, Nov. 4, 1982, Pat. No. 4,612,409.

[30] Foreign Application Priority Data

| Nov. 4, 1981 | [JP] | Japan | 56-177685 |
| Dec. 15, 1981 | [JP] | Japan | 56-203155 |
| Dec. 28, 1981 | [JP] | Japan | 56-213119 |
| Apr. 9, 1982 | [JP] | Japan | 57-60109 |

[51] Int. Cl.$^4$ .................. H01L 31/06; H01L 27/14
[52] U.S. Cl. .................. 136/244; 136/256; 136/258

[58] Field of Search ......... 136/244, 245, 256, 258 PC, 136/258 AM

[56] References Cited

U.S. PATENT DOCUMENTS

| 4,253,881 | 3/1981 | Hezel | 136/256 |
| 4,398,343 | 8/1983 | Yamazaki | 437/2 |
| 4,410,558 | 10/1983 | Izu et al. | 427/39 |

FOREIGN PATENT DOCUMENTS

| 54-149489 | 11/1979 | Japan | 136/258 AM |
| 56-43774 | 4/1981 | Japan | 136/245 |

Primary Examiner—Aaron Weisstuch
Attorney, Agent, or Firm—Armstrong, Nikaido, Marmelstein, Kubovcik & Murray

[57] ABSTRACT

A flexible photovoltaic device includes a flexible substrate and a photovoltaic device body. The flexible substrate is a metal foil or film provided with an electric insulating layer of a material having an electric conductivity of not more than $10^{-7}$ $(\Omega\cdot cm.)^{-1}$ at the time of light impinging and selected from a heat resistant polymer, a metal oxide, a crystalline or amorphous silicon compound and an organometallic compound.

10 Claims, 3 Drawing Sheets

FLEXIBLE PHOTOVOLTAIC DEVICE

This is a division of application Ser. No. 835,717 filed Mar. 3, 1986, U.S. Pat. No. 4,773,942, which is a division of application Ser. No. 439,627, filed Nov. 4, 1982, U.S. Pat. No. 4,612,409.

BACKGROUND OF THE INVENTION

The present invention relates to photovoltaic devices, and more particularly to flexible photovoltaic devices composed of non-single-crystal semiconductors.

Photovoltaic devices such as solar cells and photodetectors are capable of converting solar radiation into usable electrical energy. However, the devices of this type have the large problem to be overcome that the generating cost is very large as compared with other means for generating electric energy. The main reasons are that the efficieny of utilizing a semiconductor material constituting the body of the device is low and much energy is required in producing the semiconductor material. In recent years, it has been proposed to use amorphous silicon as a semiconductor material, and this proposal has been considered as a technique having a possibility of overcoming the above problems. The amorphous silicon can be produced inexpensively and in large quantities by glow discharge decomposition of silicon compounds such as silane and fluorosilane. The amorphous silicon so prepared has a low average density of localized states in the band gap, namely not more than $10^{17}$ eV$^{-1}$cm.$^{-3}$, and impurity doping of N-type or P-type is possible in the same manner as in the preparation of crystalline silicon.

A representative prior art solar cell using amorphous silicon is one prepared by forming a transparent electrode on a glass substrate capable of transmitting visible rays, forming a P-type amorphous silicon layer, an undoped amorphous silicon layer and a N-type amorphous silicon layer on the transparent electrode in that order by glow discharge, and providing an ohmic contact electrode on the N-type layer. If light enters the P-type layer, undoped layer and N-type layer through the glass substrate and transparent electrode, electron-hole pairs are mainly generated in the undoped layer. They are attracted by the PIN junction internal electric field created by the abovementioned layers and are collected at the electrodes to generate a voltage between the both electrodes. In solar cells of such a type, the open-circuit voltage is about 0.8 V, and accordingly the cells are not used as they are as a power source for equipment requiring a large power source voltage.

In order to overcome this drawback, it is proposed to raise the voltage by forming plural generating zones on a single substrate and contacting the respective generating zones in series, as disclosed in Japanese Unexamined Patent Publication (Tokkyo Kokai) No. 107276/1980. However, the solar cells prepared according to this proposal still have the drawbacks that a large surface area is required due to low conversion efficiency, and that series connection of multiple devices is necessary because the voltage per single device is only about 0.8 V. Also, the solar cell has no flexibility due to the use of a rigid substrate such as glass. On the other hand, flexible solar cells are required in the field of electronic machines because of the development of flexible printed boards and film type liquid crystal displays.

A solar cell using a polymer thin film rich in flexibility and heat resistance, such as polyimide, as a substrate is disclosed in Japanese Unexamined Patent Publication No. 149489/1979. However, the use of the polymer film as a substrate has the disadvantages that the substrate is curled during the deposition of the amorphous silicon and flat solar cells are not obtained, and because the substrate is not uniformly heated due to the deformation during the deposition non uniform amorphous silicon layers are formed.

It is an object of the present invention to provide a flexible photovoltaic device.

A further object of the invention is to provide a flexible and heat resistant photovoltaic device.

Another object of the invention is to provide a flexible, small-sized photovoltaic device having a plurality of generating zones on a single substrate.

Still another object of the invention is to provide a flexible integrated solar cell capable of generating an increased open-circuit voltage.

These and other objects of the present invention will become apparent from the description hereinafter.

SUMMARY OF THE INVENTION

In accordance with the present invention, there is provided a photovoltaic device comprising a substrate including a metal foil and an electric insulating thin film having an electric conductivity of not more than about $10^{-7}$ ($\Omega$.cm.)$^{-1}$ during of light impingement, and a photovoltaic device body of non-single-crystal semiconductors, said body being formed on said electric insulating thin film.

DETAILED DESCRIPTION

Figure 1:
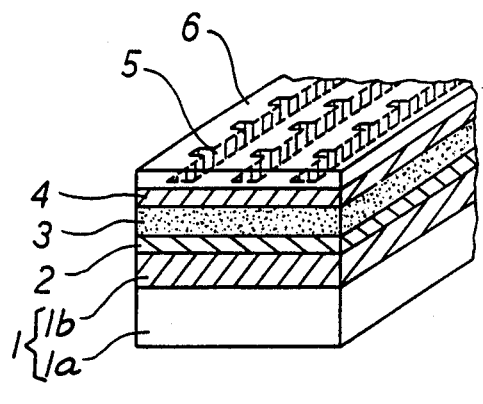
FIG. 1 is a perspective view showing an embodiment of the photovoltaic device of the present invention.

The term "non-single-crystal" as used herein comprehends "amorphous", "semiamorphous" and "microcrystalline".

The substrate used in the present invention is an electrically insulated metal foil, in other words, a metal foil on which an electric insulating thin film is formed. The substrate is flexible and heat resistant, and accordingly it does not curl during deposition of non-single-crystal semiconductors and can be employed in the same manner as conventional substrates such as a glass plate and a stainless steel plate to provide flexible photovoltaic devices.

A foil or thin film of a metal having a Young's modulus of not less than $8 \times 10^3$ kg./mm.$^2$ is employed in the present invention as a metal foil for constituting the flexible substrate. The metal includes, for instance, aluminum, copper, iron, nickel, stainless steel, and the like. The thickness of the metal foil is selected from 5 $\mu$m. to 2 mm., preferably from 50 $\mu$m. to 1 mm.

Any material having an electric conductivity of not more than $10^{-7}$ $(\Omega.cm.)^{-1}$, preferably not more than about $10^{-9}$ $(\Omega.cm.)^{-1}$, during light impingement can be employed as the material of the electric insulating thin film. For instance, polymer having a flexibility and heat resistance and an inorganic material having an electric conductivity of not more than about $10^{-7}$ $(\Omega.cm.)^{-1}$ can be employed as materials of the electric insulating layer of the substrate.

Examples of the flexible and heat resistant polymer thin film used as the electric insulating layer of the substrate are, for instance, polyimide, polyamide, polyamidimide, phenol resin, thermosetting polyester, thermoplastic polyester, polyhydantoin, polyparabanic acid, poly-p-xylylene, silicone, cyclized polybutadiene homopolymer and copolymers, and blends of cyclized polybutadiene. The thickness of the polymer insulation layer is from 1,000 angstroms to 100 $\mu$m., preferably from 1 to 20 $\mu$m. The polymer film is formed in a usual application manner. For instance, a varnish is prepared by dissolving a polymer or a precursor thereof in a solvent, and applied to the surface of the metal foil by spraying, dipping, coating or printing, and is then dried and hardened by heating, ion bombarding or irradiation of ultraviolet rays, $\beta$ rays, $\gamma$ rays or electrom beam.

Examples of the inorganic material film used as the electric insulating layer of the substrate are, for instance, a metal oxide such as SiO, SiO$_2$, Al$_2$O$_3$, TiO or TiO$_2$, crystalline or amorphous silicon carbide, silicon nitride and silicon carbon nitride, i.e. Si$_{(1-x)}$C$_x$, Si$_{(1-y)}$N$_y$, Si$_{(1-x-y)}$C$_x$N$_y$, the hydrides thereof, i.e. Si$_{(1-x)}$C$_x$:H, Si$_{(1-y)}$N$_y$:H and Si$_{(1-x-y)}$C$_x$N$_y$:H, and the fluorides thereof, i.e. Si$_{(1-x)}$C$_x$:F:H, Si$_{(1-y)}$N$_y$:F:H and Si$_{(1-x-y)}$C$_x$N$_y$:F:H. Electric insulating layers may also be fabricated from an organometallic compound such as an organosilicon compound, an organotitanate compound, an organotin compound or an organozirconium compound. The electric insulating thin film is obtained by, for instance, sputter deposition or electron beam deposition of a metal oxide, chemical vapor deposition of organometallic compounds, oxidative decomposition of coatings of organometallic compounds, and an oxidation treatment such as anodization of aluminum. The above micro-crystalline or amorphous silicon compound thin film can be obtained by sputtering or glow discharge decomposition. In the case of sputtering, the desired thin film is obtained by employing polycrystalline SiC or Si$_3$N$_4$ as a target, or by employing Si and graphite, etc. as a target. In the case of glow discharge decomposition, the desired thin film is obtained by a glow discharge in a mixture of a silicon compound such as silane and a carbon and/or nitrogen compound. In that case, preferably a doping gas is not employed, but the silicon compound may be doped with an impurity such as boron or phosphorus so long as the electric conductivity of the obtained thin film is not more than $10^{-7}$ $(\Omega.cm.)^{-1}$, preferably not more than $10^{-9}$ $(\Omega.cm.)^{-1}$, during light impingement. An amorphous silicon (a-Si) thin film prepared by sputtering or glow discharge of silane or fluorosilane may also be employed as an insulation layer of the substrate, since if a strong light such as sun light impinges on the a-Si layer, the electric conductivity of the a-Si layer increases and it serves as a protective circuit so that the photoelectric current leaks. The thin film of the organometallic compound is formed on a metal foil or film by coating application. The organometallic compounds and the prepolymers obtained by hydrolyzing the compounds are employed. They may be employed alone or in admixture thereof. The organometallic compound or the prepolymer, which may be dissolved in a solvent if necessary, is applied to the metal foil by spraying, dipping or coating, and is dried and hardened to form a film. The thickness of the inorganic material film used as an electric insulating layer is not particularly limited so long as the metal foil or film is electrically insulated. The thickness is usually selected from 100 angstroms to 20 $\mu$m.

The electric insulating layer may be a combination of the polymer thin film contiguous to the metal foil and an inorganic material thin film contiguous to a lower electrode of the photovoltaic device to be fabricated. In that case, if necessary, at least one intermediate layer made of another material may be further provided between the polymer thin film and the inorganic material thin film. The use of the combination of the polymer film and the inorganic material film as an electric insulation layer is advantageous in that there is avoided the lowering of the device characteristics which may occur, in the case of using only a polymer film as an insulation layer, during the device fabrication due to generation of a gas from the polymer. Such gas generation causes release at the interface between the insulation layer and the device or occurrence of cracks in the device, and flexibility is improved by a decrease of the thickness of the inorganic material film and moreover the insulation and the surface smoothness of the substrate are improved.

An example of forming an insulation layer using a combination of a polymer film and an inorganic material film will be given below. A dimethylacetoamide solution of polyamide acid (solid content: 15% by weight) was applied on the cleaned surface of a stainless steel foil having a thickness of 0.1 mm. by means of a bar coater (clearance: 350 $\mu$m.). After drying at 150° C. for 30 minutes, it was hardened at 300° C. for 30 minutes to form a polyimide film. The coated foil was placed in a vacuum vapor deposition apparatus, and a SiO$_2$ layer was formed on the surface of the polyimide layer by electron beam deposition (foil temperature: about 300° C., vapor source: fused silica). The thickness of the polyimide layer was about 20 $\mu$m. and the thickness of the SiO$_2$ layer was about 3,000 angstroms. The thus obtained substrate had a sufficient flexibility, and even if it was bent or deformed within the limits of practical use, release and cracking of the insulation layer did not occur. On the substrate, stainless steel was deposited in a thickness of about 4,000 angstroms by sputtering to form a lower electrode. On the electrode, a photovoltaic device body having a structure of P-type a-Si/I-type a-Si/N-type a-SiC was formed by glow discharge decomposition. An ITO transparent electrode having a thickness of about 1,000 angstroms was then formed on the device body by electron beam deposition. The thus fabricated flexible photovoltaic device had the following characteristics under a solar illumination power of 100 mW/cm.$^2$: short-circuit current density (Jsc)=14.5 mA/cm.$^2$, open circuit voltage (Voc)=0.89 V, curve fill factor (FF)=60% and conversion efficiency ($\eta$)=7.74%.

Referring to FIG. 1, which shows an embodiment of the flexible thin film solar cell according to the present invention, a substrate is designated as 1. An electric insulating layer 1b such as a flexible, heat resistant polymer thin film or an inorganic material thin film is formed on a metal foil 1a. On the surface of the insulation layer 1b, a lower electrode 2 which comes into ohmic contact with a P-type or N-type non-single-crystal semiconductor is formed in a desired pattern in a thickness of about 500 angstroms to about 1 μm. by deposition or sputtering. Examples of the material of the electrode 2 are metals such as aluminum, molybdenum, stainless steel, nickel, platinum, gold and silver and conductive metal oxides such as $SnO_2$, $In_2O_3$ and ITO (indium-tin-oxide)($In_2O_3+SnO_2$). On the surface of the electrode 2 is a photovoltaic device body 3 composed of non-single-crystalline semiconductor layers such as amorphous silicon semiconductor layers. The photovoltaic device body 3 is prepared in a thickness of 0.2 to 2 μm. by a plasma glow discharge method or a sputter deposition method. A transparent electrode layer 4 which acts as a potential barrier to the photovoltaic device body 3 and through which most of the light can transmit, e.g. Pt, ITO, $SnO_2$, or a composite of ITO and $SnO_2$, is formed on the photovoltaic device body 3 by deposition in a thickness of 500 to 3,000 angstroms. On the transparent electrode layer 4 is a comb-shaped electrode grid 5 made of Al, Ag, Ti-Ag, Pd, or the like. An antireflection layer 6, e.g. a zirconium oxide film, may be provided, as occasion demands. Also, if necessary, a passivation film is further provided on the antireflection layer 6.

Figure 2:
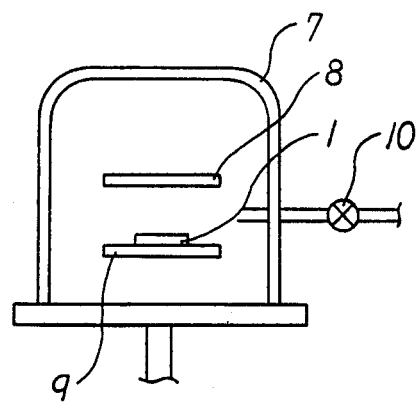
FIG. 2 is a schematic view of an apparatus for forming an amorphous or semiamorphous semiconductor thin film and a photovoltaic device body composed of the amorphous or semiamorphous semiconductor thin film layers of the photovoltaic device of the present invention by a plasma glow discharge method or a sputtering method.

FIG. 2 is a schematic view of a vacuum apparatus for forming an amorphous silicon thin film and for fabricating the photovoltaic device body 3 including the amorphous silicon thin film layers by a plasma glow discharge method or a sputtering deposition method. In FIG. 2, numerals 8 and 9 indicate electrodes and numeral 10 represents a valve for introducing a predetermined gas into a vacuum chamber 7. A substrate 1 with a lower electrode 2 for the photovoltaic device is mounted on the electrode 9 with the lower electrode 2 facing up. In the case of the plasma glow discharge method, after evacuating the chamber 7 to a pressure of $1 \times 10^{-6}$ to $10 \times 10^{-6}$ Torr, a gas such as $SiH_4$ is introduced into the chamber through the valve 10 at a pressure of $10^{-2}$ to 5 Torr with or without a dopant gas. A DC or RF voltage of 1 to several tens of MHz is then applied between the electrodes 8 and 9, thereby causing a plasma to generate. This state is maintained for several tens of minutes, during which the photovoltaic device body 3 including for example an intrinsic amorphous silicon thin film layer having a thickness of 0.1 to 1 μm., a carrier lifetime of not less than $10^{-7}$ second, a density of localized states of not more than $10^{17}$/cm.$^3$eV and a carrier mobility of not less than $10^{-3}$ cm.$^2$/v.sec. is formed on the surface of the electrode 2.

In the case of the sputtering deposition method, after evacuating the chamber 7 to a pressure of $1\times10^{-6}$ to $10\times10^{-6}$ Torr, a mixed gas of hydrogen or the like and an inert gas such argon is introduced into the chamber through the valve 10 at a pressure of $5\times10^{-3}$ to $10^{-1}$ Torr. A DC or RF voltage of 1 to several tens of MHz is then applied between the electrode 8 having a target thereon and the electrode 9 on which the substrate with the lower electrode 2 for the photovoltaic device is mounted, thereby causing a plasma to generate in the chamber. A voltage of about 1 to 3 kV, an electric current of 100 to 300 mA and a power of 100 to 300 W are sufficient. If the above state is maintained for about 60 minutes, the amorphous silicon photovoltaic device body 3 including an intrinsic amorphous silicon thin film layer having a thickness of 0.1 to 1 μm., a carrier lifetime of not less than $10^{-7}$ second, a density of localized states of not more than $10^{17}$/cm.$^3$eV and a carrier mobility of not less than $10^{-3}$ cm.$^2$/V.sec. is formed.

The term "non-single-crystal semiconductor" as used herein means amorphous, semiamorphous and microcrystalline semiconductors. In the case of employing such semiconductors in photovoltaic devices, a small thickness is sufficient because they have a large optical absorption coefficient, and accordingly such semiconductors are suitable for use in flexible solar cells. The amorphous, semiamorphous or microcrystalline semiconductor can be made of an element of Group IV of the Periodic Table such as Si, Ge or Sn, or an amorphous, semiamorphous or microcrystalline multicomponent semiconductor made of at least two elements selected from the group consisting of Si, Ge, Sn, N and C, and the semiconductors in which the dangling bonds are terminated by an element such as hydrogen or a halogen, are preferable. An amorphous semiconductor and a microcrystalline semiconductor may be used in combination in forming a photovoltaic device body. In device fabrication, structures such as Shottkey barrier, PN, PIN, PINPIN junctions or combinations thereof can be used. Especially, devices using, amorphous Si, SiN, SiGe, SiSn or SiC containing H or F as an I-layer are preferred. As occasion demands, semiconductors may be arranged in the order of large optical band gap in fabrication of PIN junction photovoltaic devices.

The lower electrode 2 for ohmic contact and the transparent electrode layer 4 can be formed by a resistance heating method, electron beam deposition method or sputtering deposition method.

Preferably, the photovoltaic device body 3 is of a three layer structure. For instance, the first layer is a P-type amorphous silicon thin film having a boron concentration of not less than $10^{19}$/cm.$^3$, the second layer is an intrinsic amorphous silicon thin film, and the third layer is a N-type amorphous silicon thin film having a phosphorus concentration of not less than $10^{19}$/cm.$^3$. The first layer may be of a N-type conductivity and the third layer may be of a P-type conductivity. The short-circuit current and the open circuit voltage can be largely improved by employing at least as a window material a P-type or N-type amorphous or microcrystalline silicon semiconductor having an optical band gap of not less than about 1.85 eV, an electric conductivity of not less than about $10^{-8}$ ($\Omega$.cm.)$^{-1}$ at 20° C. and a diffusion potential (exhibited in PIN junction) of not less than about 1.1 volts. In the case of using the above-mentioned photovoltaic device body 3 as a solar cell, the solar cell is constructed so that an open circuit voltage may be obtained by radiating light from the side of the transparent electrode 4 such as a Pt or ITO electrode, thereby causing electron-hole pairs to be generated in the photovoltaic device body 3 by the light and causing these electrons and holes to reach a depletion layer region.

Figure 3A:
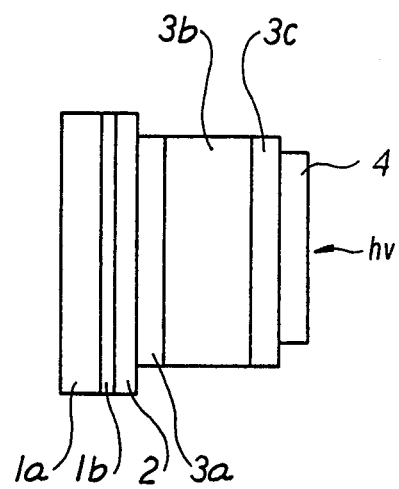
FIG. 3A is a schematic view illustrating a basic structure of a PIN junction photovoltaic device of the type wherein the light impinges on the P-layer side.
Figure 3B:
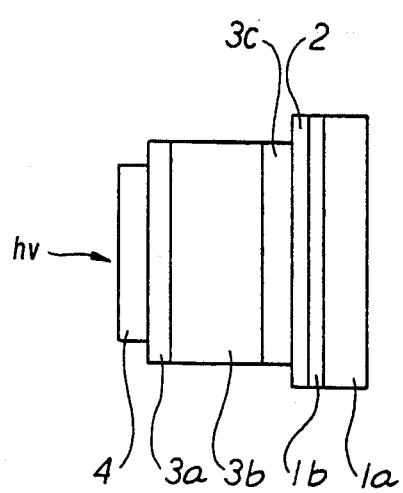
FIG. 3B is a schematic view illustrating a basic structure of a PIN junction photovoltaic device of the type wherein the light impinges on the N-layer side.

In FIGS. 3A and 3B, representative examples of the basic construction of the photovoltaic device of the present invention are shown. Illustrated in FIG. 3A is a photovoltaic device of the type wherein light impinges on the P-layer side. For instance, the device of this type has the construction: stainless steel foil-insulating film-electrode-N-I-P-transparent electrode. Illustrated in FIG. 3B is a photovoltaic device of the type wherein light impinges on the N-layer side. For instance, the device of this type has the construction: stainless steel foil-insulating film-electrode-P-I-N-transparent electrode. Optionally, other constructions may be formed by interposing a thin insulation layer or a thin metal layer between the P-layer or N-layer and the transparent electrode. Any construction suffices as long as a PIN junction is included as the basic component.

In the above PIN junction, there is employed, as I-layer, an intrinsic amorphous silicon (hereinafter referred to as "I-type a-Si") material having a carrier lifetime of not less than about $10^{-7}$ second, a density of localized states of not more than about $10^{17} cm.^{-3}eV^{-1}$ and a mobility of not less than $10^{-3} cm.^2/V.sec.$, which is prepared by a glow discharge decomposition of silane or its derivatives, fluorosilane or its derivatives, or a mixture thereof. Such an I-type a-Si layer is joined with P-type and N-type doped amorphous or microcrystalline silicon semiconductors to give a PIN junction structure. Preferably, at least one of the P-layer and N-layer is a doped amorphous or microcrystalline semiconductor having an optical band gap of not less than about 1.85 eV, an electric conductivity of not less than about $10^{-8} (\Omega.cm.)^{-1}$ at 20° C. and a diffusion potential (exhibited in the PIN junction) of not less than about 1.1 volts. Of course, such a semiconductor may be employed in both the P-layer and the N-layer. The doped layers are obtained by doping the above-mentioned I-type a-Si with either an element of Group III of the Periodic Table to provide the P-type a-Si or an element of Group V of the Periodic Table to provide the N-type a-Si. If only flexibility is desired, a PIN homojunction may be formed.

The P-type and N-type amorphous or microcrystalline semiconductors are not particularly limited. Preferable amorphous or microcrystalline semiconductors include amorphous or microcrystalline silicon carbide of the formula: a-Si$_{(1}$ *silicon nitride of the formula: a-Si$_{(1-y)}$N$_y$*, amorphous or microcrystalline silicon carbon nitride of the formula: a-Si$_{(1-x-y)}$C$_x$N$_y$ and the hydrides and fluorides thereof. These amorphous or microcrystalline silicon compounds, hydrogenated or fluorinated, are prepared by glow discharge in a mixture of a hydrogen or fluorine compound of silicon such as silane or fluorosilane, a hydrogen or fluorine compound of carbon or nitrogen such as a hydrocarbon or ammonia, and a doping gas.

Figure 4:
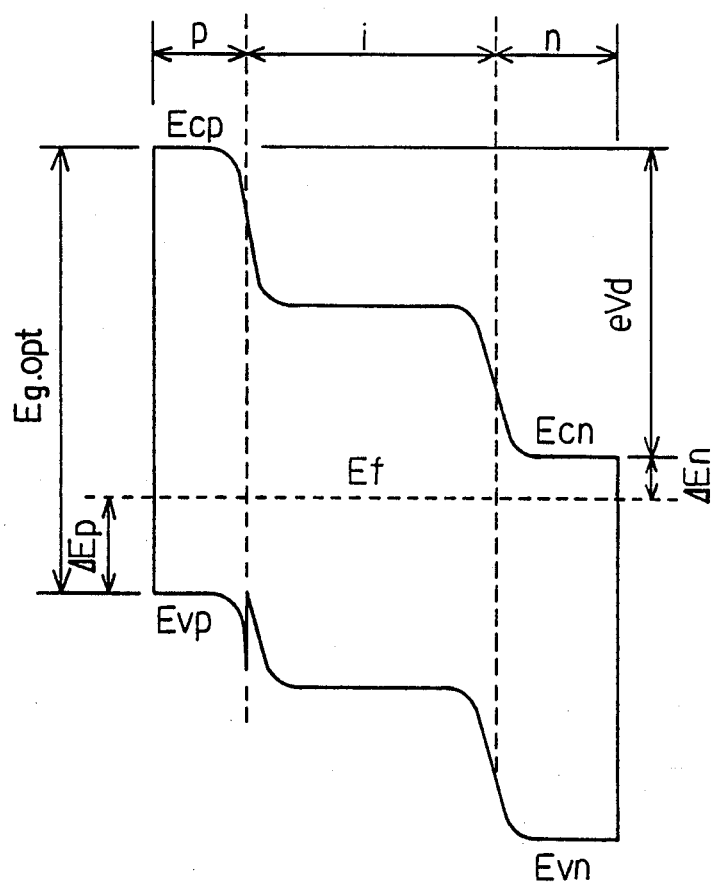
FIG. 4 is a diagram showing an energy band profile of the PIN heterojunction photovoltaic device of the present invention.

The above exemplified amorphous or microcrystalline semiconductors have a large optical band gap, and accordingly provide a very high open circuit voltage (Voc), though it is naturally considered that the short-circuit current density (Jsc) is increased when they are used as a window material for a PIN junction photovoltaic device. In a PIN junction photovoltaic device using the above amorphous or microcrystalline semiconductors, there is a correlation between the diffusion potential (Vd) and the open circuit voltage of the device as depicted by the band profile of FIG. 4. The trend of the relation is almost the same without reference to the kind of the amorphous or microcrystalline semiconductor positioned on the light impinging side. The diffusion potential (Vd) is the difference obtained by subtracting the sum of the activation energies of the P and N doped layers from the optical band gap (Eg.opt) of the amorphous or microcrystalline semiconductor positioned on the side exposed to the light. As shown in FIG. 4, let Ecn stand for the energy level of the conduction band on the N side and Evp for the energy level of the valence band on the P side, and the activation energy $\Delta$Ep and $\Delta$En can be determined based on the dependency of electric conductivity on temperature. Since $\Delta$Ep=Ef−Evp holds for the P-type and $\Delta$En=Ecn−Ef for the N-type, there ensues eVd=Eg.opt−($\Delta$Ep+$\Delta$En). In the case of incidence of light on the N side, the diffusion potential is obtained in the same manner by subtracting the Fermi levels (Ef) of the P and N layers from the optical band gap (Eg.opt) of the N-type semiconductor.

It is preferable to employ an amorphous or microcrystalline semiconductor having an optical band gap of at least about 1.85 eV and a diffusion potential of at least about 1.1 volts. In the case of fabricating a heterojunction photovoltaic device by employing such an amorphous or microcrystalline semiconductor, the shortcircuit current density (Jsc) and open circuit voltage (Voc) can be greatly improved. Also, an amorphous or microcrystalline semiconductor having an electric conductivity of at least $10^{-8} (\Omega cm.)^{-1}$ at room temperature is preferably used, since when the electric conductivity is less than $10^{-8} (\Omega cm.)^{-1}$, the curve fill factor (FF) is small and no practical conversion efficiency is obtained.

The PIN heterojunction photovoltaic device provided according to the present invention will be described specifically below. In one typical construction as shown in FIG. 3A, this device is of the type wherein light impinges on the P-layer side, and is composed of metal foil 1a, electric insulating thin film layer 1b, electrode 2, N-type amorphous or microcrystalline silicon semiconductor 3a, I-type amorphous silicon 3b, P-type amorphous or microcrystalline semiconductor 3c and transparent electrode 4. The transparent electrode 4 is desired to be formed of ITO and SnO$_2$, especially SnO$_2$, and it is directly formed on the P-type amorphous semiconductor by vapor deposition. More preferably, the transparent electrode is of two layer structure, and a SnO$_2$ layer having a thickness of 30 to 100 angstroms is further provided in the interface between the ITO layer and the P-type semiconductor layer. The P-type amorphous or microcrystalline semiconductor layer 3c positioned on the light impinging side is desired to have a thickness of from about 30 to about 300 angstroms, especially from 50 to 200 angstroms. Although the thickness of the I-type a-Si layer is not specifically limited, it is generally selected from about 2,500 to about 10,000 angstroms. Also, the thickness of the N-type amorphous or microcrystalline silicon semiconductor layer is not specifically limited, but is usually selected from about 150 to about 600 angstroms. A heterojunction of amorphous or microcrystalline semiconductors may be used on the side opposite to the light impinging side.

In another typical construction as shown in FIG. 3B, the device is composed of transparent electrode 4, N-type amorphous or microcrystalline semiconductor 3a, I-type amorphous silicon 3b, P-type amorphous or microcrystalline semiconductor 3c, electrode 2, electric insulating thin film 1b and metal foil 1a, and the transparent electrode side is exposed to the light. For instance, a heterojunction photovoltaic device of this type has the construction: transparent electrode-N-type a-Si$_{(1-x)}$C$_x$:H-I-type a-Si:H-P-type a-Si:H-electrodeinsulating layer-metal foil. The N-type amorphous semiconductor on the light impinging side is desired to have a thickness of from about 30 to about 300 angstroms, preferably from 50 to 200 angstroms. Although the thickness of the I-type a-Si is not specifically limited, it is generally selected from about 2,500 to about 10,000 angstroms. The thickness of the P-type amorphous or microcrystalline semiconductor layer, which is not particularly limited, is generally selected from about 150 to about 600 angstroms. The material for the transparent electrode and the method for the vacuum deposition thereof are the same as described above. Although a heterojunction of the semiconductors is employed on the light impinging side in the above description, a heterojunction of amorphous or microcrystalline semiconductors may be employed on the opposite side to the light impinging side.

A plurality of generating zones connected electrically with each other in series, each having the basic construction as shown in FIGS. 3A and 3B, can be provided on a single substrate, namely an electrically insulated metal foil, for the purpose of providing a flexible, small-sized photovoltaic device capable of generating an increased photoelectromotive force.

Figure 5A:
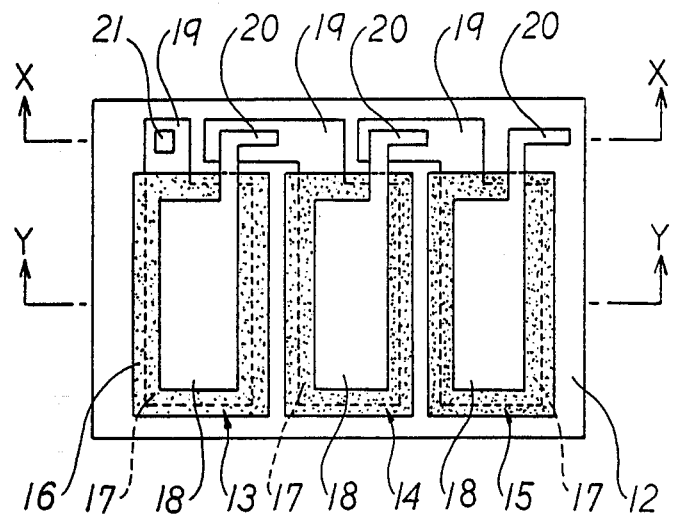
FIG. 5A is a schematic plan view showing an embodiment of the photovoltaic device of the present invention in which a plurality of generating zones provided on a single substrate are connected in series.
Figure 5B:
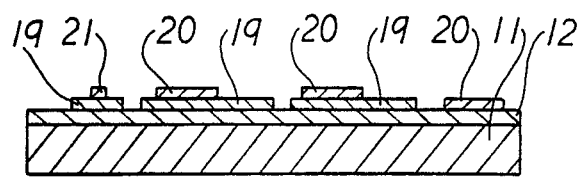
FIG. 5B is a vertical cross-sectional view taken along the line X-X of FIG. 5A.
Figure 5C:
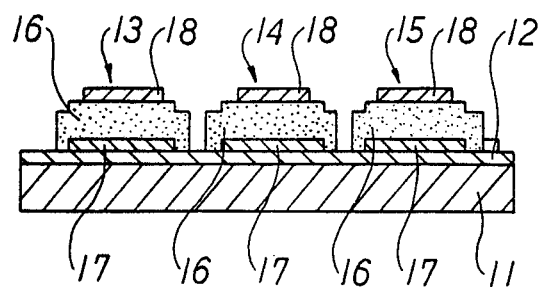
FIG. 5C is a vertical cross-sectional view taken along the line Y-Y of FIG. 5A.

Referring to FIGS. 5A, 5B and 5C, which show an embodiment of the photovoltaic device of the invention having a plurality of generating zones, numeral 11 is a metal foil, numeral 12 is an electric insulating thin film layer, and numerals 13, 14 and 15 are first, second and third generating zones formed on the insulation layer 12 of the substrate. Each of the generating zones is composed of a homojunction or heterojunction semiconductor layer 16, a first electrode 17 and a second electrode 18, both electrodes being positioned on opposite sides of the layer 16. The homojunction or heterojunction layer 16 has, for instance, the structure as shown in FIG. 3A and includes an N-type layer formed on the substrate, a nondoped layer (i.e. I-type layer) and a P-type layer. The layer 16 may extend continuously throughout the first, second and third generating zones, or may be discrete as shown in the figures.

The first electrode 17 is formed of a material which is capable of ohmic contact with the semiconductor, e.g. a metal such as Ni, Cr, Pt or Mo and a conductive metal oxide such as $SnO_2$, $In_2O_3$, ITO ($In_2O_3 + xSnO_2$, $x \leq 0.1$) or ITO/Ag. The first electrode 17 is preferably an ITO film on which a $SnO_2$ film having a thickness of 50 to 500 angstroms is formed. The second electrode 18 is a transparent electrode made of SnO, $SnO_2$, $In_2O_3$ or a composite of $SnO_2$ and ITO formed on the $SnO_2$.

The first and second electrodes 17 and 18 of each of the first, second and third generating zones 13, 14 and 15 have portions 19 and 20 extending to the outside of the respective generating zones on the substrate. The extending portion 20 of the second electrode 18 of the first generating zone 13 overlaps the extending portion 19 of the first electrode 17 of the second generating zone 14 to electrically connect with each other. Similarly, the extending portion 20 of the second electrode 18 of the second generating zone 14 and the extending portion 19 of the first electrode 17 of the third generating zone are connected to each other. A connecting portion 21 made of the same materials as the second electrode 18 may be attached to the extending portion 19 of the first electrode 17 of the first generating zone 13, as occasion demands.

The photovoltaic device as shown in FIGS. 5A to 5C is fabricated in the following manner. On the substrate, namely the metal foil 11 insulated with the insulation layer 12, each first electrode 17 having an extending portion 19 is first formed by means of selective etching, selective sputtering or vapor deposition. In the second step, the homojunction or heterojunction layer 16 is formed throughout the first, second and third generating zones. In that case, since presence of the layer 16 on the extending portions 19 must be avoided, the layer 16 is formed on only the desired portions by employing a mask covering the undesired portions, or after forming the layer 16 on the whole surface of the substrate provided with the electrode 17, the layer 16 on the undesired portions is removed by selective etching. In the next and last step, the second electrodes 18 and the connecting portion 21 are formed by selective sputtering or vapor deposition technique.

If light enters into the homojunction or heterojunction layer 16 through the second electrode 18, a voltage is generated in each of the first, second and third generating zones. Since the generating zones 13, 14 and 15 are connected to each other in series at the extending portions 19 and 20 of the first and second electrodes 17 and 18, the voltages generated at the respective zones are added, and the so added voltage is generated between the connecting portion 21 as negative electrode and the extending portion 20 of the third generating zone as positive electrode.

If the distance between the adjacent generating zones is small, there may be observed the phenomenon that an electric current flows directly between both first electrodes 17 of the adjacent zones, or both second electrodes 18 of the adjacent zones, namely, leakage current occurs. However, the occurrence of leakage current can be substantially eliminated by spacing the generating zones at a distance apart of at least 1 $\mu$m., since the resistance of the homojunction or heterojunction layer 16 is from several to several tens of M$\Omega$ at the time of light impingement. If necessary, the layer 16 may be separately formed in every generating zone, and the first electrode may be connected in series to the second electrode of the next adjacent generating zone. Also, it is advantageous for practical use to protect the photovoltaic device by covering the device from the second electrode side with an adherent transparent insulating polymer film or a transparent insulating film such as $SiO_2$, amorphous silicon carbide, amorphous silicon nitride or amorphous silicon carbon nitride film.

In the above-mentioned embodiment, a plurality of generating zones, each including a homojunction or heterojunction photovoltaic device body, are connected to each other in series, and accordingly a flexible, smallsized photovoltaic device capable of generating a desired voltage can be provided. Also, since the insulated metal foil is employed as a substrate, the photovoltaic device can be fabricated in the same manner as a conventional photovoltaic device using a glass substrate, moreover on a mass production scale.

While particular embodiments have been described, it is to be understood that various changes and modifications may be made in the invention without departing from the spirit and scope thereof.

What we claim is:

1. A photovoltaic device comprising a substrate including a metal foil and an overlaying electric insulating thin film having an electric conductivity of not more than about $10^{-7}$ ($\Omega$.cm.)$^{-1}$ during light impingement, and a photovoltaic device body of a non-single-crystal semiconductor, the device body being formed over said electric insulating thin film, and said electric insulating thin film being a layer of an inorganic material having a thickness of 100 angstroms to 20 μm selected from the group consisting of amorphous $Si_{(1-x)}C_x$, and amorphous $Si_{(1-x-y)}C_xN_y$, their hydrides and their fluorides.

2. The device of claim 1, wherein the non-single-crystal semiconductor is an amorphous silicon semiconductor or a multicomponent amorphous semiconductor made of amorphous silicon containing an element selected from the group consisting of C, N, Ge and Sn.

3. The device of claim 1, wherein the non-single-crystal semiconductor is an amorphous semiconductor made of an element selected from the group consisting of Si, Ge and Sn or a multicomponent amorphous semiconductor made of at least two elements selected from the group consisting of Si, C, N, Ge and Sn.

4. The device of claim 1, wherein the non-single-crystal semiconductor is a microcrystalline silicon semiconductor or a multicomponent microcrystalline semiconductor made of microcrystalline silicon containing an element selected from the group consisting of C, N, Ge and Sn.

5. The device of claim 1, wherein the non-single-crystal semiconductor is a microcrystalline semiconductor made of an element selected from the group consisting of Si, Ge and Sn or a multicomponent microcrystalline semiconductor made of at least two elements selected from the group consisting of Si, C, N, Ge and Sn.

6. The device of claim 1, wherein said non-single-crystal semiconductors include an amorphous semiconductor layer and a microcrystalline semiconductor layer, said amorphous semiconductor layer being an amorphous Si, Ge or Sn semiconductor or an amorphous multicomponent semiconductor made of at least two elements selected from the group consisting of Si, C, N, Ge and Sn, and said microcrystalline semiconductor layer being a microcrystalline Si, Ge or Sn semiconductor or a microcrystalline multicomponent semiconductor made of at least two elements selected from the group consisting of Si, C, N, Ge and Sn.

7. The device of claim 1, wherein said non-single-crystal semiconductors have a three layer structure of a PIN junction type.

8. The device of claim 7, wherein at least one of the P-layer and the N-layer is a multicomponent semiconductor made of a mixture of amorphous or microcrystalline silicon and an element selected from the group consisting of C, N, Ge and Sn.

9. The device of claim 1, wherein said inorganic material film is prepared by glow discharge decomposition.

10. The device of claim 1, wherein said substrate is provided with a plurality of photovoltaic device bodies on the electric insulating thin film to give a plurality of generating zones, said generating zones being connected in series to each other.

* * * * *